United States Patent [19]

Nakamura et al.

[11] Patent Number: 5,146,118
[45] Date of Patent: Sep. 8, 1992

[54] BI-CMOS LOGIC GATE CIRCUITS FOR LOW-VOLTAGE SEMICONDUCTOR INTEGRATED CIRCUITS

[75] Inventors: Michinori Nakamura; Yasuhiro Sugimoto, both of Yokohama, Japan

[73] Assignee: Kabushiki Kaisha Toshiba, Kawasaki, Japan

[21] Appl. No.: 649,901

[22] Filed: Feb. 1, 1991

[30] Foreign Application Priority Data

Feb. 7, 1990 [JP] Japan ................................ 2-27941

[51] Int. Cl.$^5$ .................... H03K 19/092; H03K 19/02
[52] U.S. Cl. .................... 307/475; 307/446; 307/454; 307/451; 307/443
[58] Field of Search ............ 307/475, 451, 454, 446, 307/570, 443, 576, 579, 585

[56] References Cited

U.S. PATENT DOCUMENTS

| | | | |
|---|---|---|---|
| 4,103,188 | 7/1978 | Morton | 307/570 |
| 4,719,370 | 1/1988 | Sugimoto | 307/570 |
| 4,727,266 | 2/1988 | Fujii et al. | 307/443 |
| 4,779,014 | 10/1988 | Masuoka et al. | 307/446 |
| 4,890,016 | 12/1989 | Tanaka et al. | 307/443 |
| 4,902,914 | 2/1990 | Masouka | 307/570 |
| 5,023,478 | 6/1991 | Boudon et al. | 307/446 |
| 5,047,669 | 9/1991 | Iwamura et al. | 307/446 |

FOREIGN PATENT DOCUMENTS

| | | |
|---|---|---|
| 0099100 | 1/1984 | European Pat. Off. . |
| 0212584 | 3/1987 | European Pat. Off. . |
| 0320582 | 6/1989 | European Pat. Off. . |
| 3006176 | 9/1981 | Fed. Rep. of Germany . |
| 2217941 | 11/1989 | United Kingdom . |

OTHER PUBLICATIONS

M. Fujishima et al., Novel BiCMOS Circuit Using Merged Device Structure, 1989 Spring National Convention Record, The Institute of Electronics, Information and Communication Engineers, C-274.

Primary Examiner—Edward P. Westin
Assistant Examiner—Richard Roseen
Attorney, Agent, or Firm—Finnegan, Henderson, Farabow, Garrett and Dunner

[57] ABSTRACT

A Bi-CMOS logic gate circuit according to the present invention comprises a complementary Bi-CMOS output circuit at the output stage composed of a first-polarity bipolar transistor and a second-polarity bipolar transistor, and a level compensation circuit, provided between the input and output terminals of the Bi-CMOS output circuit, which compensates for each forward-bias voltage between the base and emitter of the first-polarity and second-polarity bipolar transistors. This arrangement allows the Bi-CMOS output circuit to swing the output voltage from the voltage of the high-voltage supply to that of the low-voltage supply at the output stage, previously smaller in the amplitude by the amount equal to the sum of the base-emitter voltage of two bipolar transistors.

8 Claims, 2 Drawing Sheets

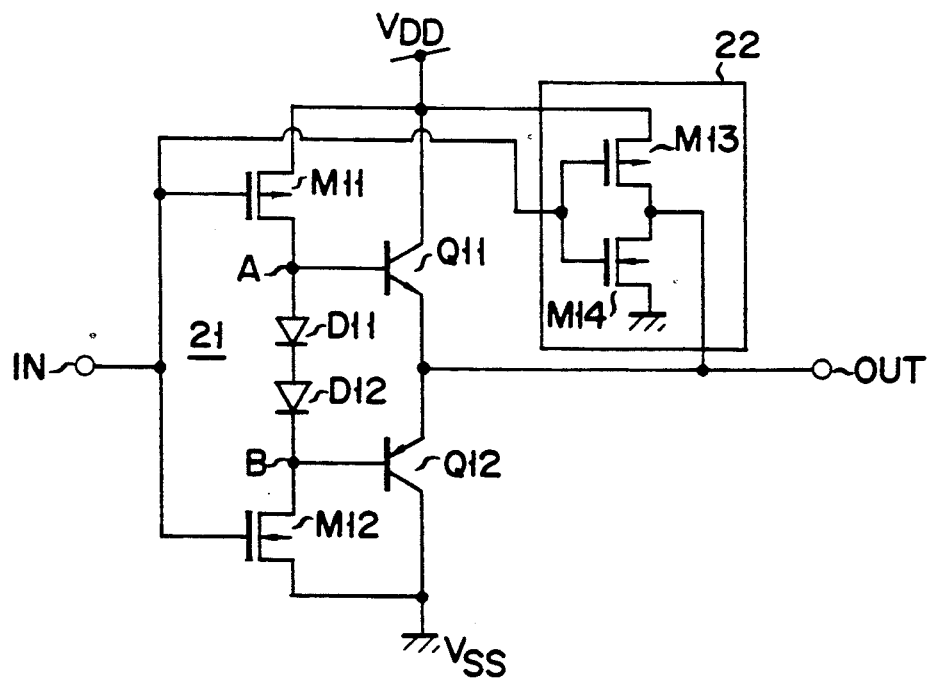
F I G. 2

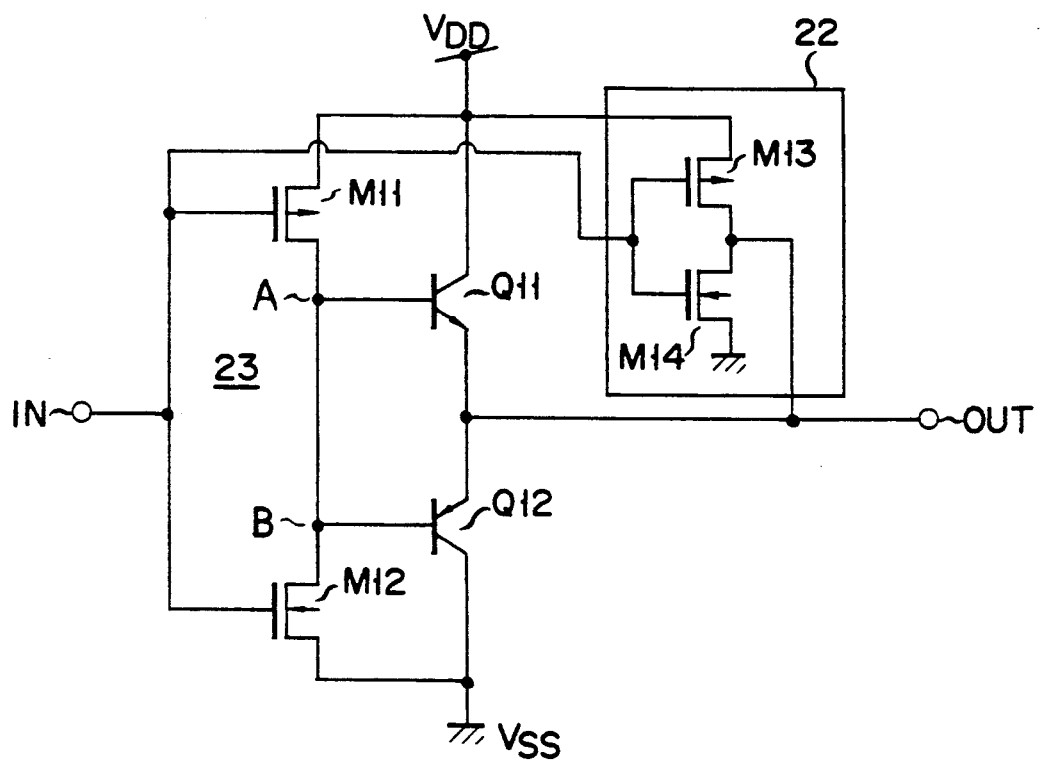
F I G. 3

BI-CMOS LOGIC GATE CIRCUITS FOR LOW-VOLTAGE SEMICONDUCTOR INTEGRATED CIRCUITS

BACKGROUND OF THE INVENTION

1. Field of the Invention

The present invention relates to Bi-CMOS logic gate circuits for low-voltage, fine-structured semiconductor integrated circuits.

2. Description of the Related Art

FIG. 1 shows an inverter circuit consisting of a conventional Bi-CMOS logic gate circuit. The structure of the circuit is based on the "Novel Bi-CMOS Circuit Using Merged Devices Structure" at The 1989 SPRING NATIONAL CONVENTION RECORD, THE INSTITUTE OF ELECTRONICS, INFORMATION AND COMMUNICATION ENGINEERS C-274.

In FIG. 1, the input terminal IN is connected to each gate of the p-channel MOS transistor M1 and the n-channel MOS transistor M2. The source of the transistor M1 is connected to the supply voltage $V_{DD}$, while the source of the transistor M2 is connected to the ground voltage $V_{SS}$. Connected across the source and drain of the transistor M1 is the collector-base path of the n-p-n transistor Q1, whereas connected across the source and drain of the transistor M2 is the collector-base path of the p-n-p transistor Q2. Two diodes D1 and D2 are connected in series across the node A, to which both transistor M1's drain and transistor Q1's base are connected, and the node B, to which both transistor M2's drain and transistor Q2's base are connected. These diodes D1 and D2 are used to store and retain the charge in the diffusion capacitance between the base and emitter of the bipolar transistors. The use of the diodes D1 and D2 enables high speed operation even with low loads.

Each emitter of the transistors Q1 and Q2 is connected to the output terminal OUT, which forms a complementary Bi-CMOS logic gate circuit made up of the n-p-n transistor Q1 and the p-n-p transistor Q2 at the output stage.

The operation of the aforementioned Bi-CMOS logic gate circuit will now be explained. Suppose that the output OUT is kept at the "H" (High) level, or at the value equal to the supply voltage $V_{DD}$ minus the base-emitter voltage $V_{BE}$ of the transistor Q1 (Q2).

When the input terminal IN is at the "H" level, the n-channel MOS transistor M2 conducts and the p-channel MOS transistor M1 is cut off, causing the voltage of the node B to be nearly the ground voltage $V_{SS}$ (0V). This makes the transistor Q2 conduct, causing the voltage of the output terminal OUT to be the voltage $V_{BE}$ (nearly 0.7 V) across the base and emitter of the transistor Q2.

When the input terminal IN changes to the "L" (Low) level, then the p-channel MOS transistor M1 conducts and the N-channel MOS transistor M2 is cut off, causing the voltage of the node A to be the supply voltage $V_{DD}$. This makes the transistor Q1 conduct, causing the voltage of the output terminal OUT to be ($V_{DD}-V_{BE}$).

Such Bi-CMOS logic gate circuits have grown smaller, which results in narrower gate widths of the elements, lowering the breakdown voltages of the elements. The decreased withstand voltages for the elements require low-voltage operation. Suppose, for example, that in a 0.5 μm rule fine Bi-CMOS circuit designed not to lose the high-speed feature, $V_{DD}$ is lower than 5 V, e.g., 3.3 V. When $V_{DD}=3.3$ V, however, the "L" level of the output is $V_{SS}=0.7$ V and the "H" level is 2.6 V, equivalent to $V_{DD}(3.3 V)-V_{BE}(0.7 V)$. This offers an output amplitude of 1.9 V, reducing heavily the noise margin of the circuit compared with the CMOS logic gate.

SUMMARY OF THE INVENTION

Accordingly, the object of the present invention is to provide a Bi-CMOS logic gate circuit that allows high-speed operation at a low voltage with a noise margin as large as that of the CMOS logic gate circuit.

The object of the present invention will be achieved by the following arrangement.

A Bi-CMOS logic gate circuit according to the present invention comprises a complementary Bi-CMOS output circuit composed of a first-polarity bipolar transistor and a second-polarity bipolar transistor at the output stage and a level compensation circuit, provided between the input and output terminals of the Bi-CMOS output circuit, which compensates for each forward bias across the base and emitter of the first-polarity and second-polarity bipolar transistors.

With the arrangement of the present invention, the CMOS inverter circuit, provided as a level compensation circuit between the input and output terminals of the Bi-CMOS output circuit, allows the output amplitude to swing fully from the voltage of the high-voltage supply to that of the low-voltage supply at the output stage, previously smaller in output amplitude by the amount equal to the sum of base-emitter voltage of the two bipolar transistors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a circuit diagram for a first embodiment of the present invention; and FIG. 3 is a circuit diagram for a second embodiment of the present invention.

DETAILED DESCRIPTION OF THE PREFERRED EMBODIMENTS

Figure 1:
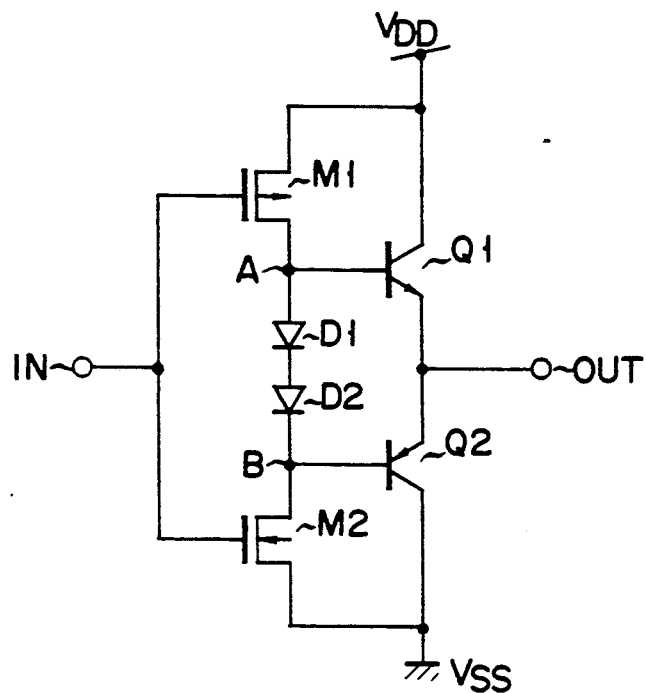
FIG. 1 is a circuit diagram for a conventional Bi-CMOS logic gate circuit.

The present invention will be explained using embodiments, referring to the accompanying drawings.

FIG. 2 shows an inverter circuit composed of a Bi-CMOS logic gate circuit according to the present invention. Each gate of a p-channel MOS transistor M11 and an n-channel MOS transistor M12 is connected to the input terminal IN. The source of the transistor M11 is connected to the supply voltage $V_{DD}$, while the source of the transistor M12 is connected to the ground voltage $V_{SS}$. Connected across the source and drain of the transistor M11 is the collector-base path of an n-p-n transistor Q11, whereas connected across the source and drain of the transistor M12 is the collector-base path of a p-n-p transistor Q11. Two diodes D11 and D12 are connected in series across the node A, to which the transistor M11's drain and the transistor Q11's base are connected, and the node B, to which the transistor M12's drain and the transistor Q12's base are connected. The diodes D11 and D12 are used to store and retain the charge in the diffusion capacitance between the base and emitter of the bipolar transistors. The diodes D11 and D12 allows high-speed operation even with low loads.

Each emitter of the transistors Q11 and Q12 is connected to the output terminal OUT so that the output stage may form a complementary Bi-CMOS output circuit 21 made up of the n-p-n transistor Q11 and p-n-p transistor Q12. In addition, the input and output terminals of a CMOS inverter circuit 22 composed of a p-channel MOS transistor M13 and an n-channel transistor M14 are connected to the input terminal IN and the output terminal OUT, respectively. That is, each gate of the transistors M13 and M14 is connected to the input terminal IN, whereas each drain of the transistors M13 and M14 is connected to the output terminal OUT. The transistor M13's source is connected to the supply voltage $V_{DD}$, while the transistor M14's source is connected to the ground voltage $V_{SS}$.

With such a configuration, when the input terminal IN is at the logical "H" level, the n-channel MOS transistors M12 and M14 conduct and the p-channel MOS transistors M11 and M13 are cut off, causing the voltage of the node B to be nearly the ground voltage $V_{SS}$. This makes the transistor Q12 conduct, lowering the voltage of the output terminal OUT to the transistor Q12's base-emitter voltage $V_{BE}$ (nearly 0.7 V). At the same time, the conducting transistor M14 in the CMOS inverter circuit 21 lowers the voltage of the output terminal OUT further to $V_{SS}$.

When the input terminal IN changes to the "L" level, the p-channel MOS transistors M11 and M13 conduct and the n-channel MOS transistors M12 and M14 are cut off, causing the voltage of the node A to be supply voltage $V_{DD}$. This makes the transistor Q11 conduct, raising the voltage of the output terminal OUT to a voltage equal to $V_{DD}$ minus the transistor Q11's base-emitter voltage $V_{BE}$ (nearly 0.7 V). At the same time, the conducting transistor M13 in the CMOS inverter circuit 21 raises the voltage of the output terminal further to $V_{DD}$. Therefore, the output of the Bi-CMOS logic gate circuit according to the present invention allows a full swing of the output voltage from 0 to $V_{DD}$.

With such an arrangement, the CMOS inverter circuit 22 connected across the input and output terminals of the Bi-CMOS output circuit 21 provides a larger output amplitude, which makes it possible to operate at a $V_{DD}$ lower than 5 V, e.g., at as low as 3.3 V. This solves the noise-margin problem encountered in conventional circuits. For example, in constructing an integrated circuit such as a gate array, use of a circuit according to the present invention as the output stage facilitates circuit design because the noise margin is as large as that of the CMOS circuit.

The present invention may apply to any complementary Bi-CMOS logic gate circuit at the output stage composed of an n-p-n transistor Q11 and a p-n-p transistor Q12. Thus, it is applicable to a Bi-CMOS output circuit 23 without the diodes D1 and D2 of FIG. 2 as shown in FIG. 3. A number of modifications of the CMOS inverter circuit 22 having a full-swing in output voltage may be considered.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A Bi-CMOS logic gate circuit for semiconductor integrated circuits, comprising:
    a Bi-CMOS output circuit, having an input terminal and an output terminal, for performing logic operations between a first potential and a second potential, complementarily arranged MOS transistors of a first conductivity type and a second conductivity type, each having a current path and having a gate connected to the input terminal, and complementarily arranged bipolar transistors of a first polarity and a second polarity, each having a base and having an emitter connected to the output terminal;
    a first node connecting one end of the current path of the MOS transistor of the first conductivity type and the base of the bipolar transistor of the first polarity;
    a second node connecting one end of the current path of the MOS transistor of the second conductivity type and the base of the bipolar transistor of the second polarity;
    means for transmitting current between said first node and said second node; and
    output circuit means, provided between said input and output terminals, for compensating for a voltage drop between each base and emitter of the complementarily arranged bipolar transistors when said bipolar transistors are rendered conductive.

2. A Bi-CMOS logic gate circuit according to claim 1, wherein said Bi-CMOS output circuit constitutes a Bi-CMOS inverter circuit, and transmitting means retains a diffusion capacitance between each base and emitter of said complementarily arranged bipolar transistors.

3. A Bi-CMOS logic gate circuit according to claim 2, wherein said circuit means for retaining the diffusion capacitance between the base and emitter of each of said complementarily arranged bipolar transistors comprises diode elements.

4. A Bi-CMOS logic gate circuit for semiconductor integrated circuits, comprising:
    a first MOS transistor of a first conductivity type, with a source, gate, and drain and a first-polarity bipolar transistor with a base, an emitter, and a collector, the source and the collector being connected to a first electric potential;
    a second MOS transistor of a second conductivity type, with a source, gate, and drain and a second-polarity bipolar transistor with a base, an emitter, and a collector, the source and the collector being connected to a second electric potential;
    a voltage retaining circuit for retaining a base-emitter diffusion capacitance provided between said base of said first-polarity bipolar transistor, connected to said drain of said first MOS transistor, and said base of said second-polarity bipolar transistor, connected to said drain of said second MOS transistor;

an input terminal connected to the gates of said first and second MOS transistors;

an output terminal connected to the emitters of said first-polarity and second-polarity bipolar transistors; and output circuit means, provided between said input and output terminals, for compensating for a voltage drop between the base and emitter of said first-polarity and second-polarity bipolar transistors when said bipolar transistors are rendered conductive.

5. A Bi-CMOS logic gate circuit according to claim 4, wherein said level compensation circuit is a CMOS inverter with a driving capability of swinging from said first electric potential to said second electric potential, and with input and output terminals being connected in parallel with said input and output terminals, respectively.

6. A Bi-CMOS logic gate circuit according to claim 4, wherein said voltage retaining circuit is composed of diode elements.

7. A Bi-CMOS logic gate circuit according to claim 4, wherein said voltage retaining circuit is composed of two diodes connected in series.

8. A Bi-CMOS logic gate circuit for semiconductor integrated circuits, comprising:

a first MOS transistor of a first conductivity type, with a source, gate, and drain and a first-polarity bipolar transistor with a base, an emitter, and a collector, the source and the collector being connected to a first electric potential;

a second MOS transistor of a second conductivity type, with a source, gate, and drain and a second-polarity bipolar transistor with a base, an emitter, and a collector, the source and the collector being connected to a second electric potential;

a voltage retaining circuit for retaining a base-emitter diffusion capacitance provided between said base of said first-polarity bipolar transistor, connected to said drain of said first MOS transistor, and said base of said second-polarity bipolar transistor, connected to said drain of said second MOS transistor;

an input terminal connected to the gates of said first and second MOS transistors;

an output terminal connected to the emitters of said first-polarity and second-polarity bipolar transistors; and a CMOS inverter circuit composed of a third MOS transistor, of the first conductivity type, and a fourth MOS transistor, of the second conductivity type, each gate of said third and fourth MOS transistors being connected to said input terminal, which has a driving signal in a range of said first to second electric potentials, and each drain of said third and fourth MOS transistors being connected to said output terminal.

* * * * *